United States Patent
Seomun et al.

(10) Patent No.: US 9,984,732 B2
(45) Date of Patent: May 29, 2018

(54) VOLTAGE MONITOR FOR GENERATING DELAY CODES

(71) Applicant: Samsung Electronics Co., Ltd., Suwon-si, Gyeonggi-do (KR)

(72) Inventors: Jun Seomun, Seoul (KR); Insub Shin, Suwon-si (KR); Kyungtae Do, Changwon-si (KR); JungYun Choi, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days. days.

(21) Appl. No.: 15/436,234

(22) Filed: Feb. 17, 2017

(65) Prior Publication Data

US 2017/0301381 A1   Oct. 19, 2017

(30) Foreign Application Priority Data

Apr. 19, 2016   (KR) .................. 10-2016-0047715

(51) Int. Cl.
  *G11C 7/22*   (2006.01)
  *G11C 7/10*   (2006.01)

(52) U.S. Cl.
  CPC ............. *G11C 7/1012* (2013.01); *G11C 7/10* (2013.01); *G11C 7/222* (2013.01)

(58) Field of Classification Search
  CPC ..................................... G11C 7/22; G11C 7/10
  USPC ........................................ 365/233.5, 189.02
  See application file for complete search history.

(56) References Cited

U.S. PATENT DOCUMENTS

| | | | | |
|---|---|---|---|---|
| 5,146,121 A * | 9/1992 | Searles | ................. | H03K 5/131 307/155 |
| 5,212,716 A * | 5/1993 | Ferraiolo | ............. | H03L 7/0814 327/284 |
| 5,457,719 A * | 10/1995 | Guo | ....................... | H03K 5/131 327/2 |
| 5,712,884 A * | 1/1998 | Jeong | .................... | H03L 7/0812 327/149 |
| 5,890,100 A * | 3/1999 | Crayford | ................ | G01R 31/30 324/762.02 |

(Continued)

FOREIGN PATENT DOCUMENTS

JP   2008-85205 A   4/2008
KR   10-2015-0126788 A   11/2015

(Continued)

*Primary Examiner* — Michael Tran
(74) *Attorney, Agent, or Firm* — Myers Bigel, P.A.

(57) ABSTRACT

Voltage monitors include a predelay cell having an input responsive to a first clock signal. This cell is configured to generate a predelayed clock signal at an output thereof. A serially-connected string of data delay cells is provided, which has an input responsive to the predelayed clock signal. A serially-connected string of clock delay cells is provided, which has an input responsive to a second clock signal that is synchronized to the first clock signal. A plurality latches are provided. The latches have respective data inputs, which are responsive to first periodic signals generated at respective outputs of the serially-connected string of data delay cells, and respective clock/sync terminals, which are responsive to second periodic signals generated at respective outputs of the serially-connected string of clock delay cells. The latches enable loading of a delay code value, which indicates power supply voltage variation.

20 Claims, 11 Drawing Sheets

(56) References Cited

U.S. PATENT DOCUMENTS

| | | | |
|---|---|---|---|
| 6,313,688 B1 * | 11/2001 | Lee | H03H 11/22 327/113 |
| 6,566,900 B2 | 5/2003 | Amick et al. | |
| 6,815,989 B2 * | 11/2004 | Seo | H03H 11/26 327/158 |
| 6,922,111 B2 | 7/2005 | Kurd et al. | |
| 7,126,399 B1 * | 10/2006 | Lee | G11C 7/1006 327/261 |
| 7,548,823 B2 | 6/2009 | Singh et al. | |
| 7,679,133 B2 | 3/2010 | Son et al. | |
| 8,060,766 B2 | 11/2011 | Konstadinidis et al. | |
| 8,368,385 B2 | 2/2013 | Barton et al. | |
| 8,497,694 B2 | 7/2013 | Chua-Eoan et al. | |
| 8,513,729 B2 | 8/2013 | Choe et al. | |
| 8,553,466 B2 | 10/2013 | Han et al. | |
| 8,559,235 B2 | 10/2013 | Yoon et al. | |
| 8,627,160 B2 | 1/2014 | Devta-Prasanna et al. | |
| 8,654,587 B2 | 2/2014 | Yoon et al. | |
| 8,669,794 B2 | 3/2014 | Park et al. | |
| 8,847,777 B2 | 9/2014 | Ramaswami | |
| 8,951,865 B2 | 2/2015 | Goda | |
| 8,994,091 B2 | 3/2015 | Lee et al. | |
| 9,076,879 B2 | 7/2015 | Yoo et al. | |
| 9,164,563 B2 | 10/2015 | Berry, Jr. et al. | |
| 9,466,669 B2 | 10/2016 | Rodder et al. | |
| 2004/0108877 A1 * | 6/2004 | Cho | H03K 5/135 327/158 |
| 2011/0095795 A1 * | 4/2011 | Kim | G11C 7/22 327/158 |
| 2011/0233648 A1 | 9/2011 | Seol et al. | |
| 2012/0098688 A1 * | 4/2012 | Kim | H03M 3/372 341/143 |
| 2014/0129885 A1 * | 5/2014 | Chen | G01R 31/31853 714/726 |
| 2014/0354264 A1 | 12/2014 | Turullois | |
| 2015/0046721 A1 | 2/2015 | Drake et al. | |

FOREIGN PATENT DOCUMENTS

| | | |
|---|---|---|
| KR | 10-1622036 B1 | 5/2016 |
| WO | WO 2015/161890 A1 | 10/2015 |

* cited by examiner

VOLTAGE MONITOR FOR GENERATING DELAY CODES

REFERENCE TO PRIORITY APPLICATIONS

This US non-provisional patent application claims priority under 35 USC § 119 to Korean Patent Application No. 10-2016-0047715, filed Apr. 19, 2016, the entirety of which is hereby incorporated herein by reference.

BACKGROUND

Example embodiments of inventive concepts relate to voltage monitors.

In a semiconductor circuit, particularly a high-performance semiconductor circuit, a supplied voltage may swing depending on an operation environment and the level of a performed operation within the circuit. Generally, a voltage supplied to support the worst case when a voltage decreases significantly is set to be greater than a value required for the case of a normal state. However, because this conventional method causes power consumption of a semiconductor circuit to increase, competitiveness of products is weakened.

To overcome the above disadvantage, when a supplied voltage of a circuit starts decreasing, the decrease of the supplied voltage is detected. Operating speed or work level of the circuit is changed based on a result of the detection to allow a normal operation to be performed even when a voltage decreases. For achieving this, it is important to rapidly and accurately know a voltage state of the circuit. A manner of monitoring a voltage of a semiconductor circuit is classified into a digital manner and an analog manner. Since it is difficult to perform integration into a digital circuit and perform a high-speed operation in the analog manner, the digital manner has been widely used in a high-speed digital circuit.

SUMMARY

The present disclosure relates to voltage monitors that generate delay codes corresponding to power supply voltage variations. A voltage monitor according to example embodiments of inventive concepts includes at least one predelay cell, data delay cells, clock delay cells, and latch circuits. The at least one predelay cell may receive a clock and may have a first delay size. The data delay cells may be serially connected to a data path receiving an output of the at least one predelay cell and may have a second delay size. The clock delay cells may be connected to a clock path receiving the clock and may have a third delay size. The latch circuits may latch an output value of each of the data delay cells in response to a delay clock of each of the clock delay cells.

A voltage monitor according to example embodiments of inventive concepts includes a predelay selection circuit, a stage selection circuit, a delay code generation circuit, and latch circuits. The predelay selection circuit may be connected to a data path receiving a clock and may select a predelay size in response to a predelay selection code. The stage selection circuit may select at least one stage in response to a stage selection code to decide a size of delay associated with the data path. The delay code generation circuit may be connected to the selected stage and may generate a delay code. The delay code generation circuit may include serially connected data delay cells associated with the data path and clock delay cells serially connected to a clock path receiving the clock. The latch circuits may latch an output value of each of the data delay cells in response to a clock delayed by each of the clock delay cells.

Voltage monitors according to additional embodiments of the invention may include a predelay cell, which has an input terminal responsive to a first clock signal. This predelay cell is configured to generate a predelayed clock signal, which is a delayed version of the first clock signal, at an output terminal thereof. A serially-connected string of data delay cells is also provided, which has an input terminal responsive to the predelayed clock signal. These voltage monitors also include a serially-connected string of clock delay cells, which has an input terminal responsive to a second clock signal. This second clock signal is synchronized to the first clock signal. In particular, the second clock signal may be equivalent to the first clock signal (e.g., in phase) or may be a delayed version of the first clock signal. A plurality latches are also provided. These latches have respective data input terminals, which are responsive to first periodic signals generated at respective output terminals of the serially-connected string of data delay cells, and respective clock input terminals, which are responsive to second periodic signals generated at respective output terminals of the serially-connected string of clock delay cells. Based on this configuration, the latches enable loading and at least temporary storage of data that can be used as a delay code value, which indicates power supply voltage variation.

According to some of these embodiments of the invention, the predelay cell is configured as a serially-connected string of buffer cells that are equivalent to the data delay cells. In other embodiments of the invention, the clock delay cells may be configured as AND gates (with joined input terminals), which operate as delay elements. According to additional embodiments of the invention, the predelay cell is configured as a predelay selection circuit, which includes a plurality of serially-connected strings of buffer cells and a corresponding plurality of multiplexers, which are responsive to respective bits of a predelay selection code (PDSEL). In some embodiments, the plurality of serially-connected strings of buffer cells are binary-weighted relative to each other. For example, the plurality of serially-connected strings of buffer cells may include a first string of $2^N$ buffer cells and a second string of $2^{N-1}$ buffer cells, where N is a positive integer (i.e., N≥1). In addition, the plurality of multiplexers includes a first multiplexer having a first input terminal electrically connected to an input terminal of the first string of $2^N$ buffer cells and a second input terminal electrically connected to an output terminal of the first string of $2^N$ buffer cells. The plurality of multiplexers may also include a second multiplexer having a first input terminal, which is electrically connected to an input terminal of the second string of $2^{N-1}$ buffer cells and an output terminal of the first multiplexer, and a second input terminal, which is electrically connected to an output terminal of the second string of $2^{N-1}$ buffer cells.

According to still further embodiments of the invention, the predelay cell may be configured to include a predelay selection circuit responsive to the first clock signal and a stage selection circuit responsive to a periodic signal generated at an output terminal of the predelay selection circuit. The predelay selection circuit can contain a first plurality of serially-connected strings of buffer cells and a corresponding first plurality of multiplexers responsive to respective bits of a predelay selection code. The stage selection circuit can contain a second plurality of serially-connected strings of buffer cells and a corresponding second plurality of multiplexers responsive to respective bits of a stage selection code (STSEL). The predelay selection circuit may also include a serially-connected string of multiplexers having commonly-connected input terminals and respective selection terminals, which are responsive to corresponding bits of the predelay selection code. A first of the serially-connected string of multiplexers can be directly responsive to the first clock signal.

BRIEF DESCRIPTION OF THE DRAWINGS

The forgoing and other features of inventive concepts will be described below in more detail with reference to the accompanying drawings of non-limiting example embodiments of inventive concepts in which like reference characters refer to like parts throughout the different views. The drawings are not necessarily to scale, emphasis instead being placed upon illustrating principles of inventive concepts. In the drawings.

DETAILED DESCRIPTION

In general, a voltage monitor circuit may know a voltage state using a delay line with reference to the number of stages (or delay codes) transferred to the delay line for a fixed reference time. Since delay of the delay line decrease at a high voltage, a value is transferred to relatively more stages. In contrast, since delay of the delay line increases at a low voltage, a value is transferred to relatively less stages. These properties are used in the voltage monitor circuit.

Since delay variation of a delay line is caused by voltage variation when a clock frequency is constant, a voltage monitoring operation may be performed. However, a delay code varies when the clock frequency varies abruptly. Therefore, a fixed block should always be used to prevent variation of the delay code. Since a clock frequency of a digital circuit such as a central processing unit (CPU) varies at any time, it is difficult to directly use a CPU clock for the delay line. In addition, there is a design constraint to provide a separate clock for voltage monitoring. Moreover, since a voltage resolution to define characteristics of a typical voltage monitor is decided by a delay variation rate to voltage variation of a delay, the voltage resolution may decrease at a high voltage at which the delay variation rate decreases.

A voltage monitor (i.e., a 'droop detector') according to example embodiments of inventive concepts may generate a delay code indicating a voltage variation irrespective of variation of a clock frequency by using delay cells having different types of delay characteristics in a data path and a clock path.

Figure 1:
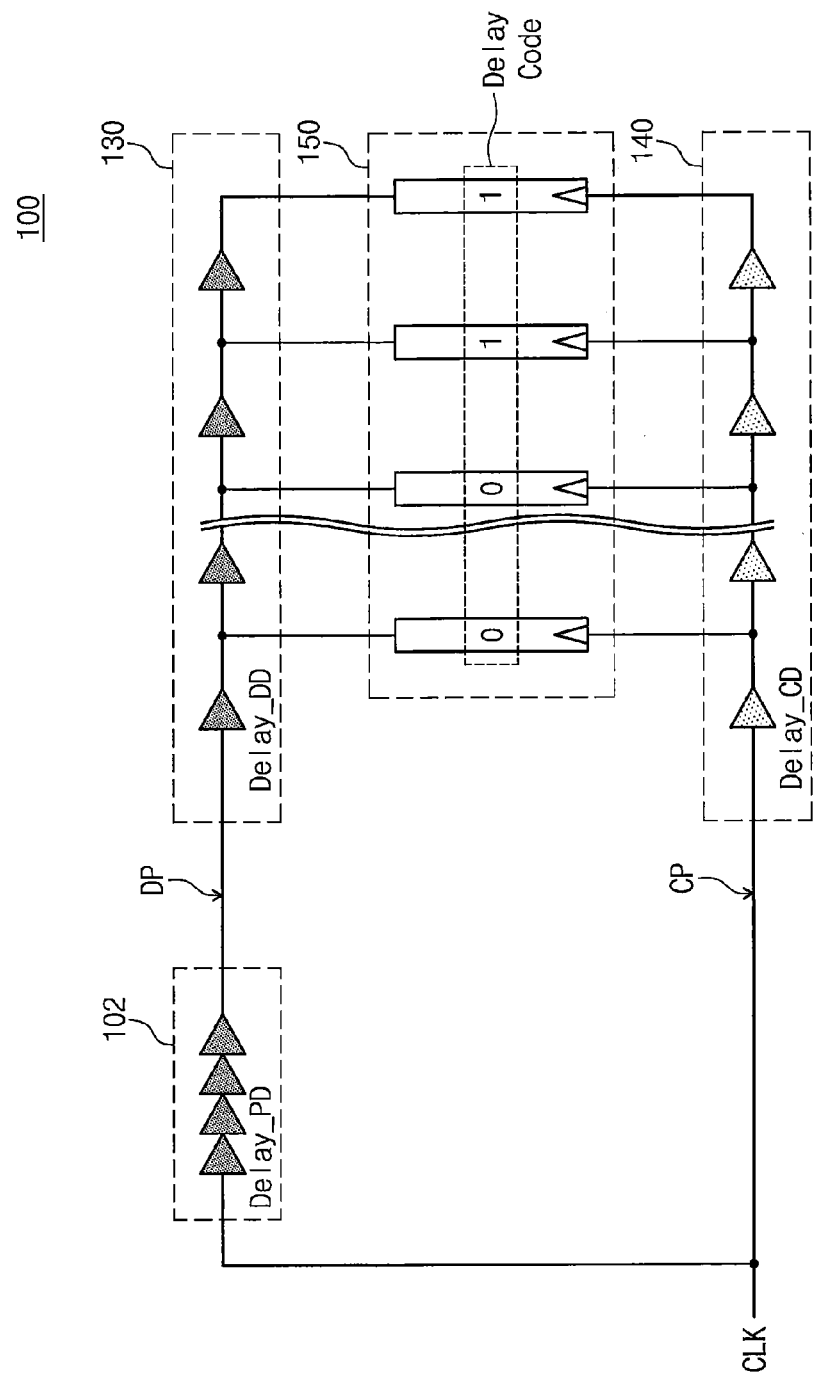
FIG. 1 conceptually illustrates a voltage monitor according to example embodiments of inventive concepts.

FIG. 1 conceptually illustrates a voltage monitor 100 according to example embodiments of inventive concepts. As illustrated, the voltage monitor 100 may include at least one predelay cell 102 associated with a data path DP ("first data delay cell 102"), data delay cells 130 associated with the data path DP ("second data delay cells 130"), clock delay cells 140 associated with a clock path CP, and latch circuits 150.

The at least one predelay cell 102 may be connected to the data path DP and may delay a clock CLK. In example embodiments, the predelay cell 102 may be implemented with at least one buffer cell. Although the predelay cell 102 shown in FIG. 1 includes four buffer cells, it is to be understood that the number of buffer cells is not limited to four. In example embodiments, the at least one predelay cell 102 may have a first delay size Delay_PD.

The data delay cells 130 may be serially connected to the data path DP and may transfer an output value of the at least one predelay cell 102. In example embodiments, each of the delay data cells 130 may be implemented with a buffer cell. In example embodiments, a buffer cell of each of the data delay cells 130 may have a second delay size Delay_DD. In example embodiments, a buffer cell of each of the data delay cells may be implemented the same as a buffer cell of the at least one predelay cell 102. In example embodiments, a buffer cell of each of the data delay cells may be implemented in a different manner than a buffer cell of the at least one predelay cell 102.

The clock delay cells 140 may be serially connected to the clock path CP and may delay a clock CLK. In example embodiments, each of the clock delay cells 140 may be implemented with a buffer cell. In example embodiments, each of the clock delay cells 140 may be implemented with a buffer cell. In example embodiments, a buffer cell of each of the clock delay cells 140 may have a third delay size Delay_CD. In example embodiments, the third delay size Delay_CD may be greater than the second delay size Delay_DD. However, it is to be understood that the third delay size Delay_CD need not be greater than the second delay size Delay_DD.

Each of the clock delay cells 140 need not be implemented with a buffer cell. Each of the clock delay cells 140 may be implemented with a certain type of delay cell having a different size than each of the data delay cells 130. For example, each of the clock delay cells 140 may be implemented with an AND gate implemented with a common input.

Each of the latch circuits 150 may latch output values ("0" or "1") of corresponding data delay cells 130 in response to a delayed clock corresponding to each of the clock delay cells 140. Latched data may be used as a delay code value indicating voltage variation.

In example embodiments, each of the latch circuits 150 may be implemented with a flip-flop. The flip-flop may be an SR flip-flop, a D flip-flop, a JK flip-flop, a T flip-flop or the like.

In example embodiments, the latch circuits 150 may detect data variation at a rising edge of a clock CLK transferred through the data delay cells 130 and may store a delay code according to a result of the detection.

In example embodiments, the latch circuits 150 may detect data variation at a falling edge of a clock CLK transferred through the data delay cells and may store a delay code according to a result of the detection.

The voltage monitor 100 may generate a delay code corresponding to a value obtained by dividing the first delay size Delay_PD of the at least one predelay cell 102 by a difference between the third delay size Delay_CD and the second delay size Delay_DD. The third delay size Delay_CD is a delay size of one clock delay cell corresponding to the clock path CP, and the second delay size Delay_DD is a delay size of one data delay cell corresponding to the data path DP. A delay difference resulting from use of a delay cell of the data path DP and a delay cell of the clock path having different delay variation characteristics may cause a delay code to vary depending on a voltage state. As a result, the voltage monitor 100 may generate a delay code corresponding to a voltage variation irrespective of a frequency of an input/detected clock CLK.

Figure 2:
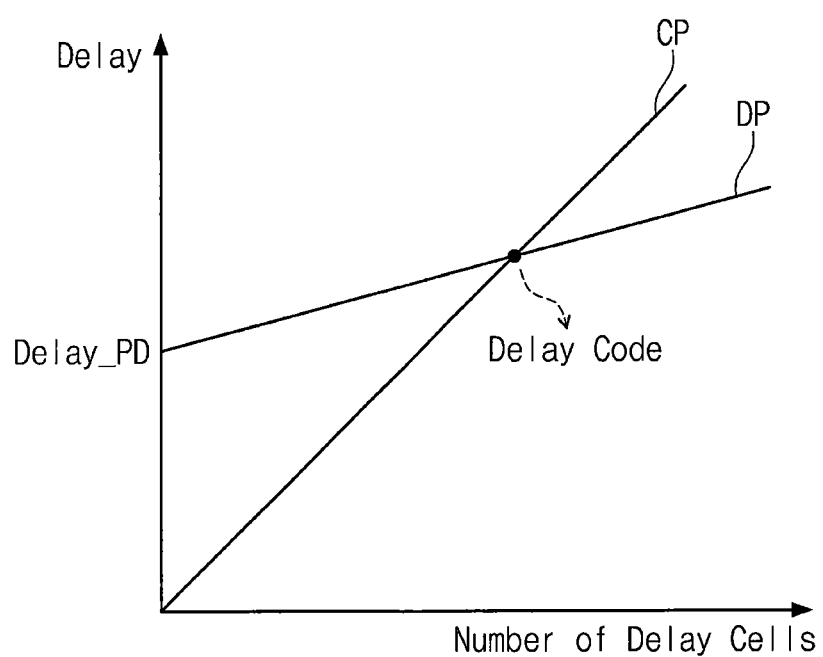
FIG. 2 conceptually illustrates delay code generation of the voltage monitor in FIG. 1.

FIG. 2 conceptually illustrates delay code generation of the voltage monitor 100 in FIG. 1. Referring to FIG. 2, a delay slope of the clock path CP can be greater than that of the data path DP. A delay of a clock CLK for the data path DP may increase from an initial delay size Delay_PD of the predelay cell 102 to a first delay slope as the number of delay cells increases. A delay of the clock CLK for the clock path CP may increases to a second delay slope as the number of delay cells increases. The second delay slope is greater than the first delay slope.

A delay code may be generated at a location where a delay of the data path DP and a delay of the clock path CP join. For example, the delay code may include data "0" stored in latch circuits up to the location where they join and data "1" stored in latch circuits following the location, and vice versa. Below, the number of delay cells may be used in connection with the number of stages.

A delay cell used in each path may be different according to process and library characteristics. In the case of a voltage monitor according to example embodiments of inventive concepts, an optimal combination may be found and used. A delay code value is decided by a delay difference between two different delay cells, so the voltage monitor 100 may secure a significantly high voltage resolution. A resolution of a conventional voltage monitor decreases at a high voltage, while a voltage monitor according to example embodiments of inventive concept may secure a high resolution at a high voltage.

The voltage monitor according to example embodiments of inventive concept may further include an added circuit configured in a basic delay code generator to tune a delay size.

Figure 3:
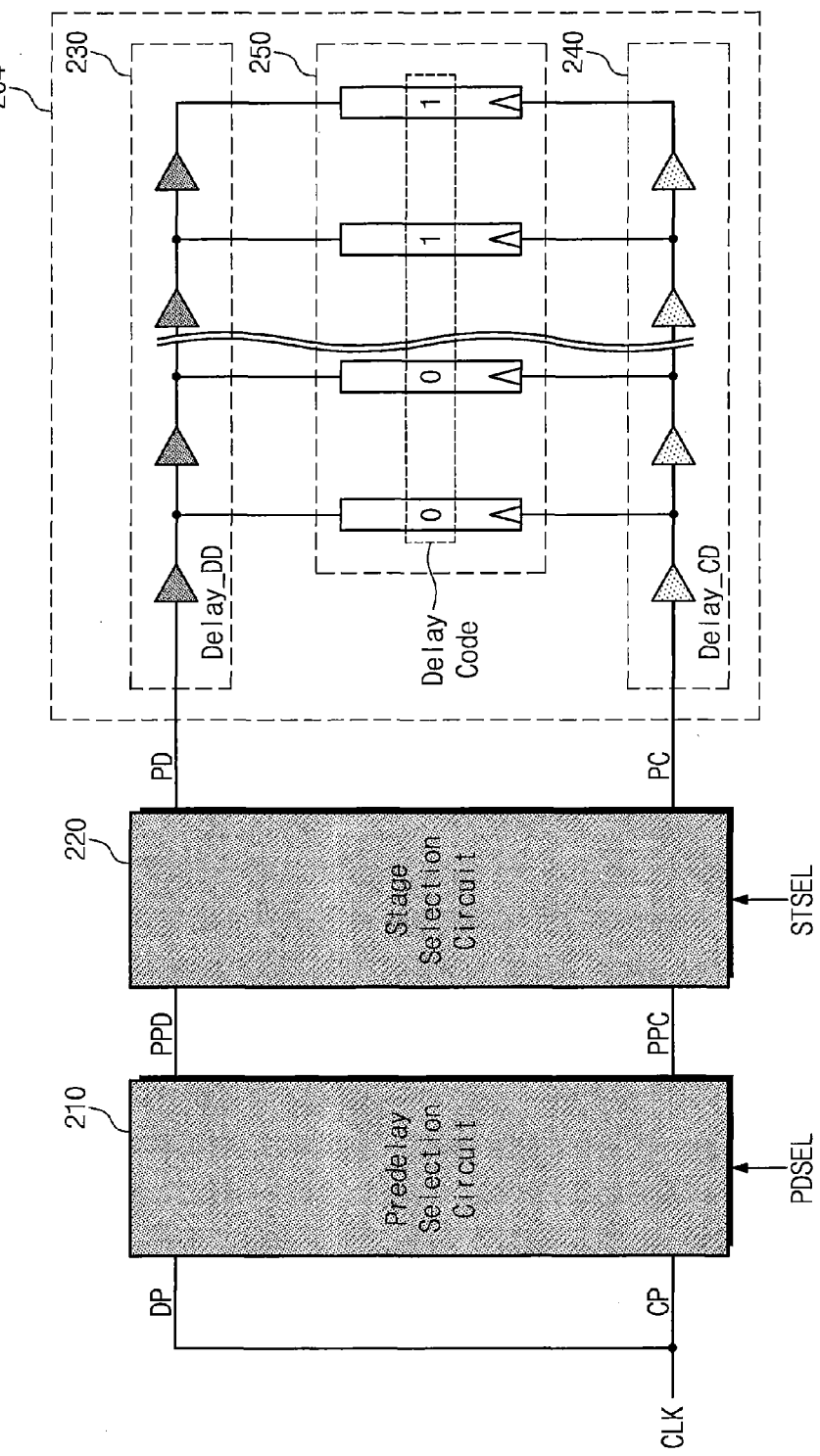
FIG. 3 illustrates a voltage monitor according to example embodiments of inventive concepts.

FIG. 3 illustrates a voltage monitor 200 according to example embodiments of inventive concepts. As illustrated, the voltage monitor 200 may include a delay code generation circuit 204, a predelay selection circuit 210, and a stage selection circuit 220.

The delay code generation circuit 204 may include data delay cells 230, clock delay cells 240, and latch circuits 250. The data delay cells 230, the clock delay cells 240, and the latch circuits 250 may be implemented the same as the data delay cells 130, the clock delay cells 140, and the latch circuits 150 shown in FIG. 1, respectively.

The predelay selection circuit 210 may select an initial delay size Delay_PD of a data path DP in response to a predelay selection code PDSEL.

The stage selection circuit 220 may select a stage where the delay code generation circuit 204 is activated or the number of stages in response to a stage selection code STSEL. A weight of the delay code generation circuit 204 may vary depending on the selection of the stage or the selection of the number of stages.

The above-described voltage monitor 200 may adjust the number of stages to be finally used and a delay added to a data path to adjust a resolution. The resolution adjustment corresponds to a code variation rate to a voltage.

Figure 4:
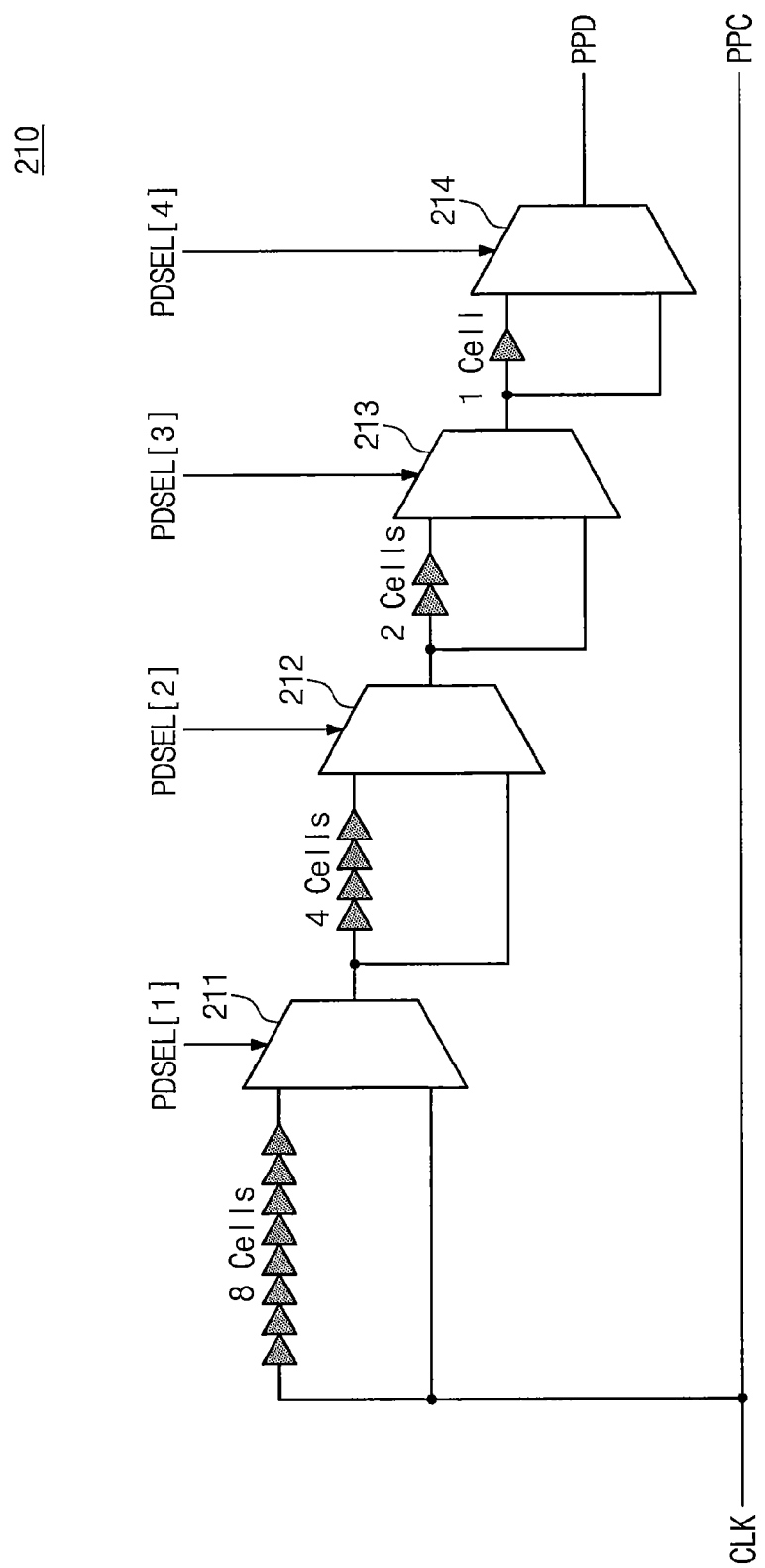
FIG. 4 illustrates a predelay selection circuit according to example embodiments of inventive concepts.

FIG. 4 illustrates a predelay selection circuit 210 according to example embodiments of inventive concepts. As illustrated, the predelay selection circuit 210 may include first to fourth multiplexers 211 to 214, however a greater or lesser number of multiplexers may be used in alternative embodiments. The first multiplexer 211 decides whether or not to select eight delay cells in response to a first predelay selection code PDSEL[1]. The second multiplexer 212 decides whether or not to select four delay cells in response to a second predelay selection code PDSEL[2]. The third multiplexer 213 decides whether or not to select two delay cells in response to a third predelay selection code PDSEL[3]. The fourth predelay selection code PDSEL[4] decides whether or not to select one delay cell in response to a fourth predelay selection code PDSEL[4].

As described above, the predelay selection circuit 210 may decide the number of delay cells connected to a data path PPD in response to a predelay selection code PDSEL[1:4]. In FIG. 4, a clock path PPC may allow a clock CLK to be transferred without delay. However, the clock path PPC need not be limited thereto. The clock path PPC may be further provided with additional multiplexers to set timings of the first to fourth multiplexers 211 to 214.

Figure 5:
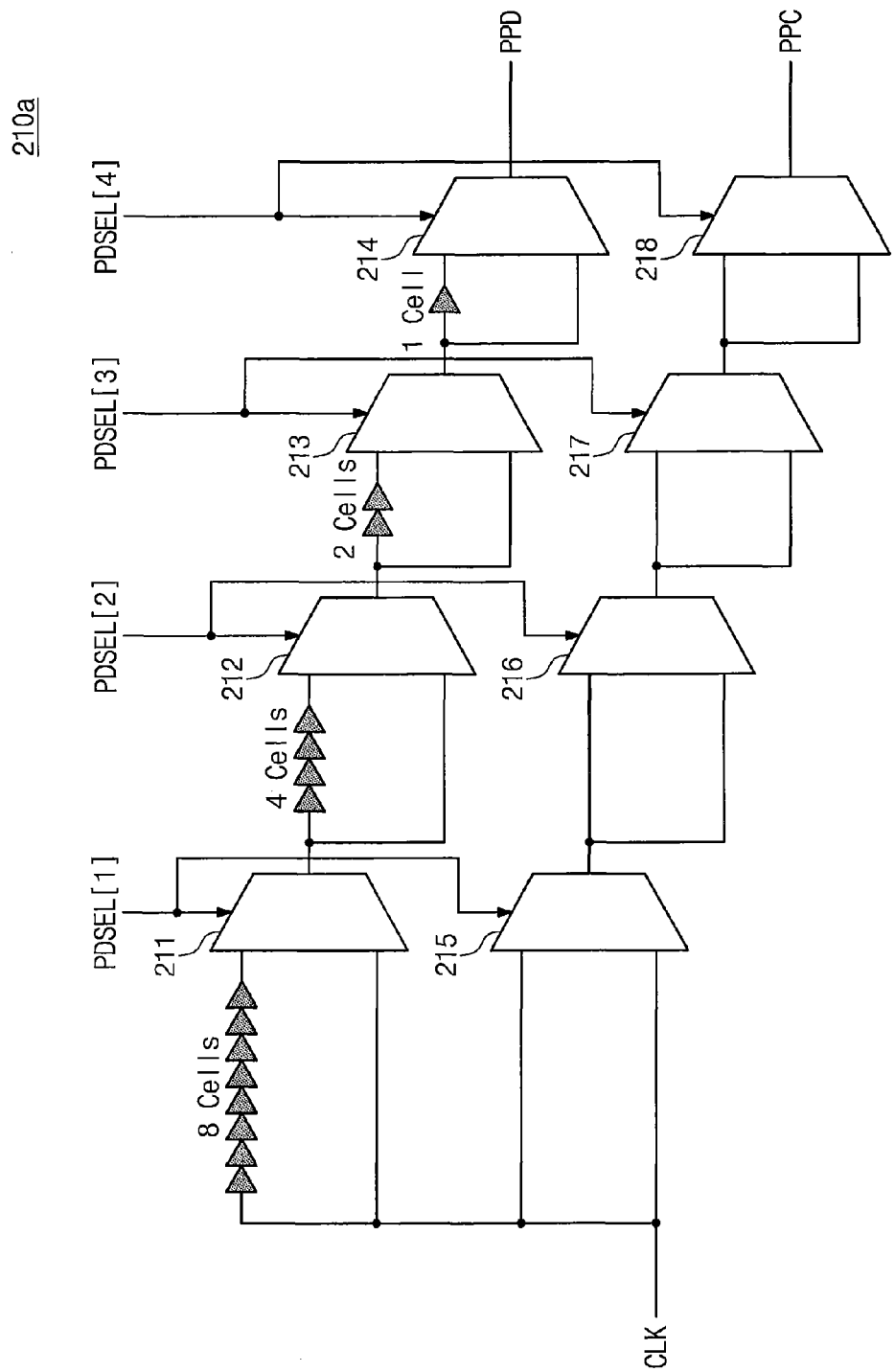
FIG. 5 illustrates a predelay selection circuit according to example embodiments of inventive concepts.

FIG. 5 illustrates a predelay selection circuit 210a according to example embodiments of inventive concepts. As compared to the predelay selection circuit 210 shown in FIG. 4, the predelay selection circuit 210a shown in FIG. 5 may further include multiplexers 215 to 218 connected to a clock path PPC. The multiplexers 215 to 218 may be disposed to correspond to multiplexers 211 to 214 connected to a data path PPD, respectively.

It is to be understood that the configurations of the predelay selection circuits 210 and 210a shown in FIGS. 4 and 5 are not intended to limit example embodiments of inventive concepts. It is to be understood that a predelay selection circuit according to example embodiments of inventive concepts is implemented to select a delay size in response to a predelay selection code PDSEL in various manners.

Figure 6:
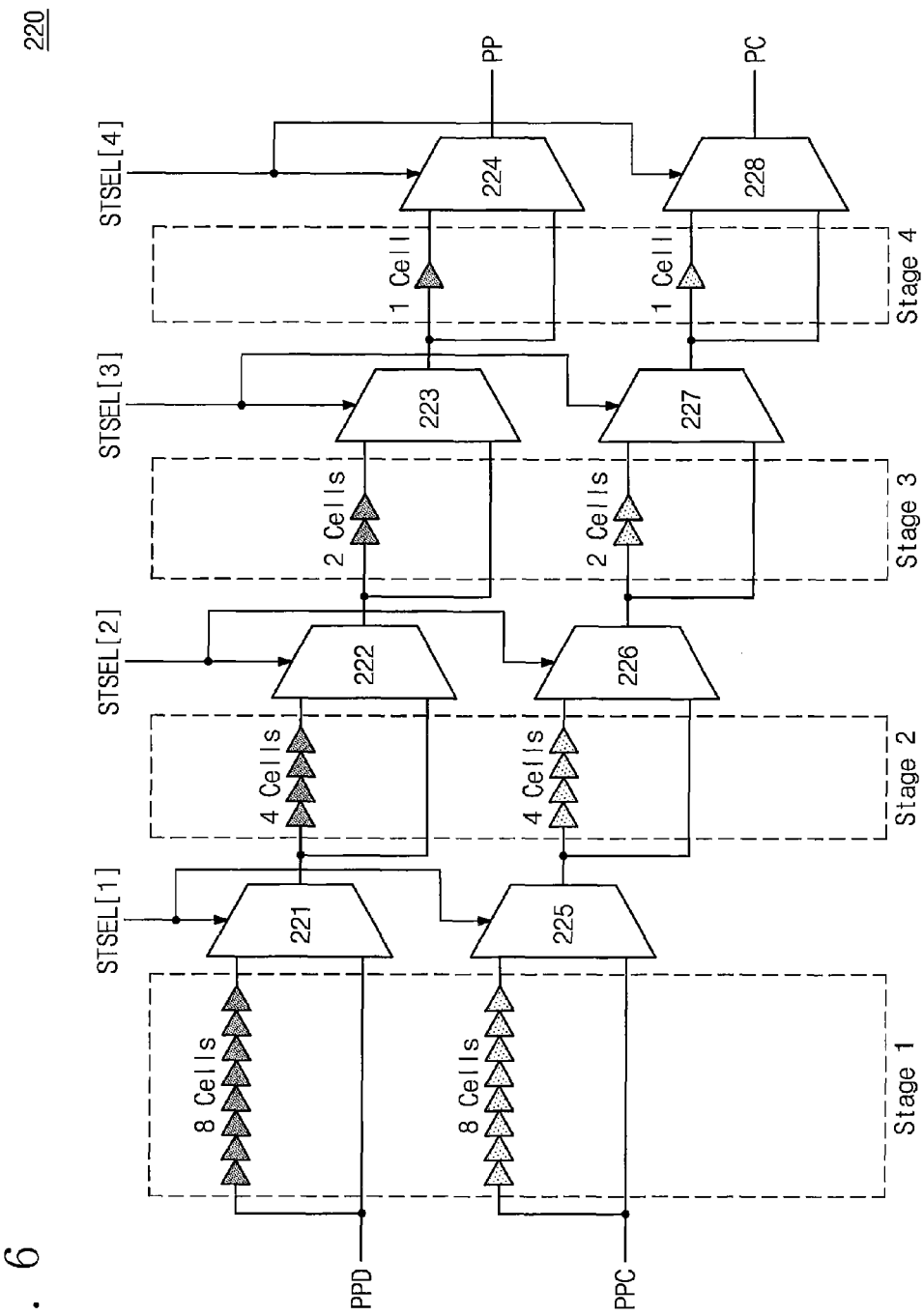
FIG. 6 illustrates a stage selection circuit according to example embodiments of inventive concepts.

FIG. 6 illustrates a stage selection circuit 220 according to example embodiments of inventive concepts. As illustrated, the stage selection circuit 220 may include a first stage Stage 1, a second stage Stage 2, a third stage Stage 3, a fourth stage Stage 4, and multiplexers 221 to 228. The first stage Stage 1 includes eight delay cells in a data path and eight delay cells in a clock path. The second stage Stage 2 includes four delay cells in a data path and four delay cells in a clock path. The third stage Stage 3 includes two delay cells in a data path and two delay cells in a clock path. The fourth stage Stage 4 includes one delay cell in a data path and one delay cell in a clock path. The multiplexers 221 to 228 select the first to fourth stages Stage 1 to Stage 4 in response to a stage selection code STSEL[1:4].

For brevity of description, four stages are shown in FIG. 6. However, it is to be understood that the number of stages according to example embodiments of inventive concepts is not limited to four. A delay weight of each of the stages Stage 1 to Stage 4 shown in FIG. 6 is decided as a multiple of two. However, it is to be understood that the delay weight is not limited to the multiple of two.

Figure 7:
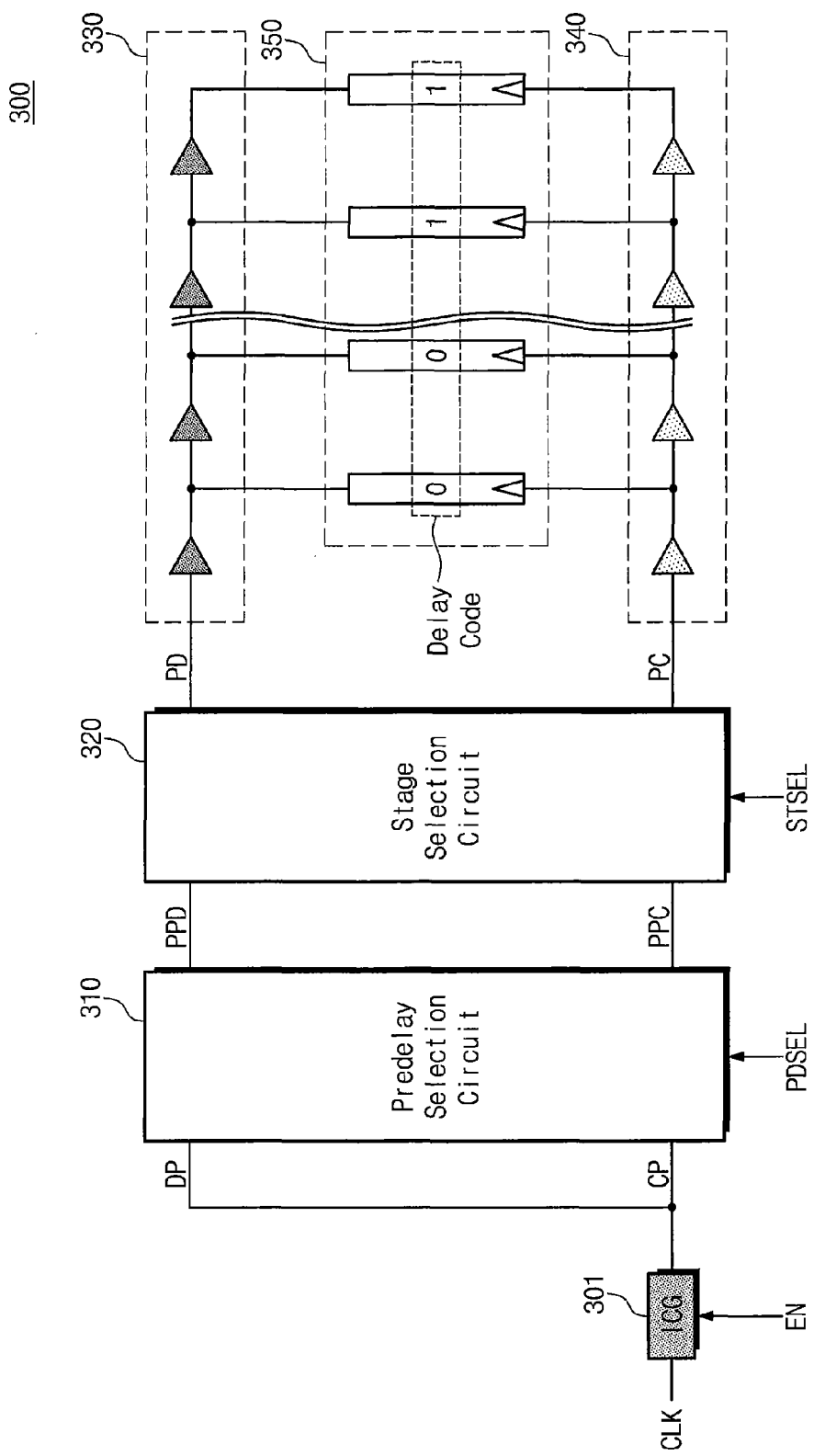
FIG. 7 illustrates a voltage monitor according to example embodiments of inventive concepts.

A voltage monitor according to example embodiments of inventive concepts may further include an internal clock generator. For example, FIG. 7 illustrates a voltage monitor 300 according to example embodiments of inventive concepts. As compared to the voltage monitor 200 shown in FIG. 3, the voltage monitor 300 shown in FIG. 7 may further include an internal clock generator (ICG) 301. The internal clock generator 301 may receive an external clock CLK and may generate an internal clock in response to an enable signal EN. The generated internal clock may be transferred to a data path and a clock path.

A predelay selection circuit 310, a stage selection circuit 320, data delay cells 330, clock delay cells 340, and latch circuits 350 may be implemented the same as those shown in FIG. 3, respectively. A voltage monitor according to example embodiments of inventive concepts may be implemented to output a captured delay code in response to another clock, if necessary.

Figure 8:
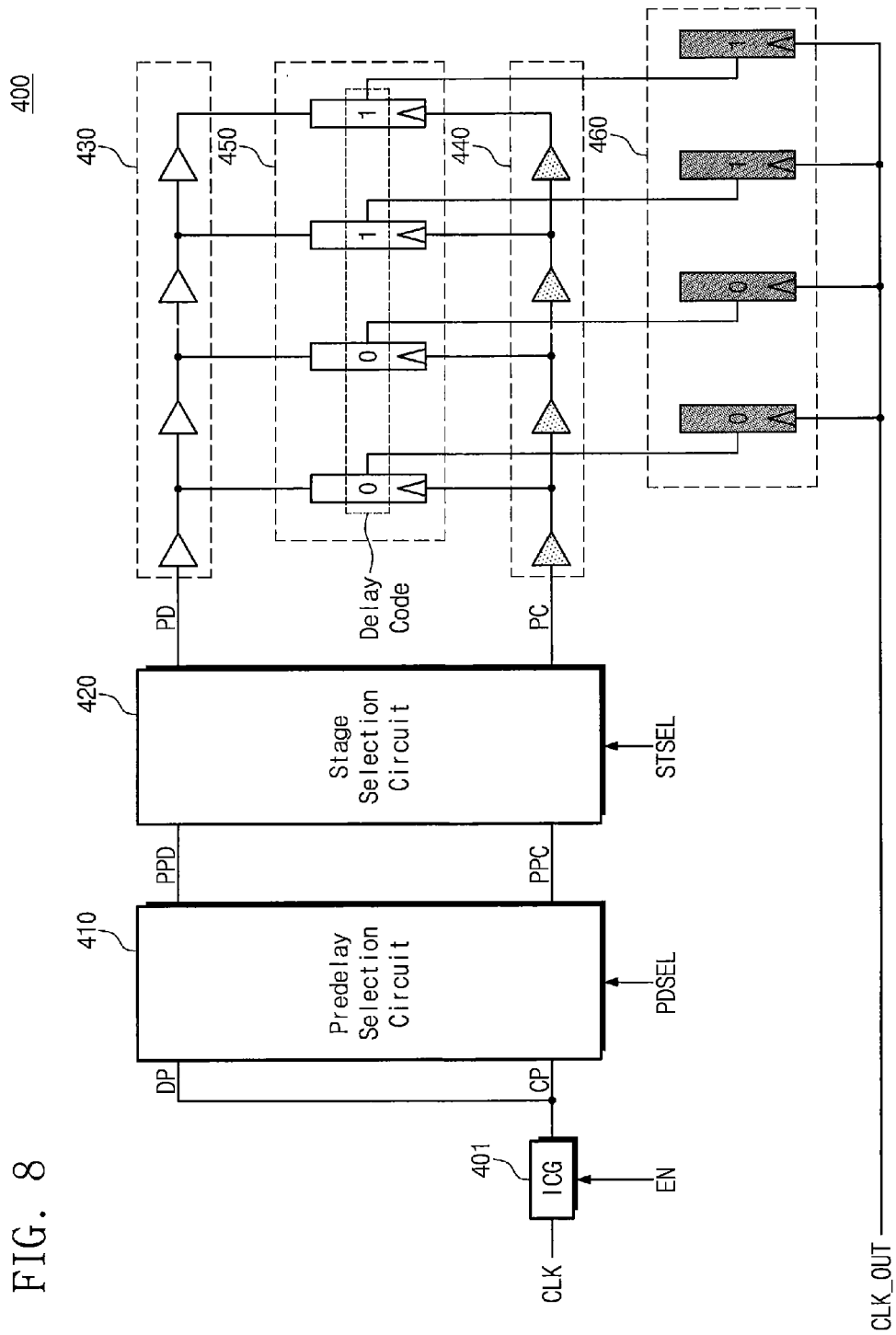
FIG. 8 illustrates a voltage monitor according to example embodiments of inventive concepts.

FIG. 8 illustrates a voltage monitor 400 according to example embodiments of inventive concepts. As compared to the voltage monitor 300 shown in FIG. 7, the voltage monitor 400 shown in FIG. 8 may further include second latch circuits 460. Each of the second latch circuits 460 may be implemented to store data stored in corresponding first latch circuits 450 in response to an output clock CLK OUT. The first latch circuits 450 may be implemented the same as the latch circuits 250 shown in FIG. 3.

A predelay selection circuit 410, a stage selection circuit 420, data delay cells 430, and clock delay cells 440 may be implemented the same as those shown in FIG. 3, respectively.

When a voltage monitor according to example embodiments of inventive concepts is integrated into a digital circuit, restriction of a monitor clock is removed to make an easy design possible. Moreover, even after the voltage monitor is fabricated, an initial delay size and the number of stages may be tuned using a predelay selection code PDSEL and a stage selection code STSEL to secure optimal performance and characteristics. Thus, the voltage monitor may perform a voltage monitoring operation for a required purpose while having minimum overhead.

Accordingly, as described hereinabove with respect to FIGS. 1-8, voltage monitors (100, 200, 300 and 400) according to additional embodiments of the invention may include a predelay cell 102, 210/220, 310/320, which has an input terminal responsive to a first clock signal (CLK). This predelay cell is configured to generate a predelayed clock signal PD, which is a delayed version of the first clock signal CLK, at an output terminal thereof. A serially-connected string of data delay cells 130, 230, 330, 430 is also provided, which has an input terminal responsive to the predelayed clock signal PD. These voltage monitors also include a serially-connected string of clock delay cells 140, 240, 340, 440, which has an input terminal responsive to a second clock signal PC. This second clock signal PC is synchronized to the first clock signal CLK. In particular, the second clock signal may be equivalent to the first clock signal CLK (i.e., in phase) or may be a delayed version of the first clock signal CLK. A plurality latches 150, 250, 350, 450 are also provided. These latches have respective data input terminals, which are responsive to first periodic signals generated at respective output terminals of the serially-connected string of data delay cells 130, 230, 330, 430, and respective clock input terminals, which are responsive to second periodic signals generated at respective output terminals of the serially-connected string of clock delay cells 140, 240, 340, 440. Based on this configuration, the latches 150, 250, 350, 450 enable loading and at least temporary storage of data that can be used as a delay code value (e.g., 0011), which digitally encodes a voltage variation (e.g., power supply variation).

According to some of these embodiments of the invention, the predelay cell may be configured as a serially-connected string of buffer cells that are equivalent to the data delay cells. In other embodiments of the invention, the clock delay cells 140, 240, 340, 440 may be configured as AND gates (with joined input terminals), which operate as delay elements. According to additional embodiments of the invention, the predelay cell is configured as a predelay selection circuit 210/210a, 310, 410, which includes a plurality of serially-connected strings of buffer cells and a corresponding plurality of multiplexers 211-214, which are responsive to respective bits of a predelay selection code PDSEL[1:4]. In some embodiments, the plurality of serially-connected strings of buffer cells are binary-weighted relative to each other (e.g., 8/4/2/1). For example, the plurality of serially-connected strings of buffer cells may include a first string of $2^N$ buffer cells and a second string of $2^{N-1}$ buffer cells, where N is a positive integer (i.e., N≥1). In addition, the plurality of multiplexers includes a first multiplexer having a first input terminal electrically connected to an input terminal of the first string of $2^N$ buffer cells and a second input terminal electrically connected to an output terminal of the first string of $2^N$ buffer cells. The plurality of multiplexers may also include a second multiplexer having a first input terminal, which is electrically connected to an input terminal of the second string of $2^{N-1}$ buffer cells and an output terminal of the first multiplexer, and a second input terminal, which is electrically connected to an output terminal of the second string of $2^{N-1}$ buffer cells.

According to still further embodiments of the invention, the predelay cell may be configured to include a predelay selection circuit 210, 310, 410 responsive to the first clock signal and a stage selection circuit 220, 320, 420 responsive to a periodic signal PPD generated at an output terminal of the predelay selection circuit 210, 310, 410. The predelay selection circuit 210, 310, 410 can contain a first plurality of serially-connected strings of buffer cells and a corresponding first plurality of multiplexers responsive to respective bits of a predelay selection code PDSEL[1:4]. The stage selection circuit can contain a second plurality of serially-connected strings of buffer cells and a corresponding second plurality of multiplexers responsive to respective bits of a stage selection code STSEL[1:4]. As shown by FIG. 5, the predelay selection circuit 210a may also include a serially-connected string of multiplexers 215, 216, 217 and 218 having commonly-connected input terminals and respective selection terminals, which are responsive to corresponding bits of the predelay selection code PDSEL[1:4]. A first of the serially-connected string of multiplexers can be directly responsive to the first clock signal CLK.

Figure 9:
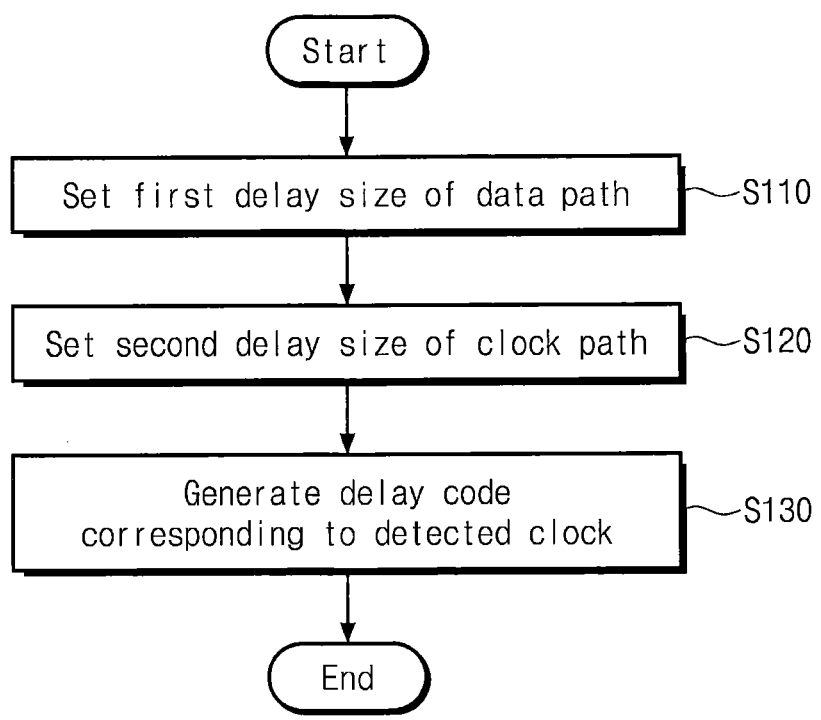
FIG. 9 is a flowchart summarizing a delay code generating method of a voltage monitor according to example embodiments of inventive concepts.

FIG. 9 is a flowchart summarizing a delay code generating method of a voltage monitor according to example embodiments of inventive concepts. The delay code generating method of the voltage monitor will now be described with reference to FIGS. 1 and 9. The voltage monitor may be the voltage monitor 100 shown in FIG. 1, the voltage monitor 200 shown in FIG. 3, the voltage monitor 300 shown in FIG. 7 or the voltage monitor 400 shown in FIG. 8, for example.

A first delay size of a data path DP to which a detected clock CLK is input may be set (S110). The first delay size includes an initial delay size and a delay size of a stage. A second delay size of a clock path CP to which the detected clock CLK is input may be set (S120). The second delay size may include a clock delay size of a stage. A delay code corresponding to the detected clock CLK may be generated (S130).

According to the above-described delay code generating method, a delay code corresponding to a difference between a clock path and a data path may be generated.

Figure 10:
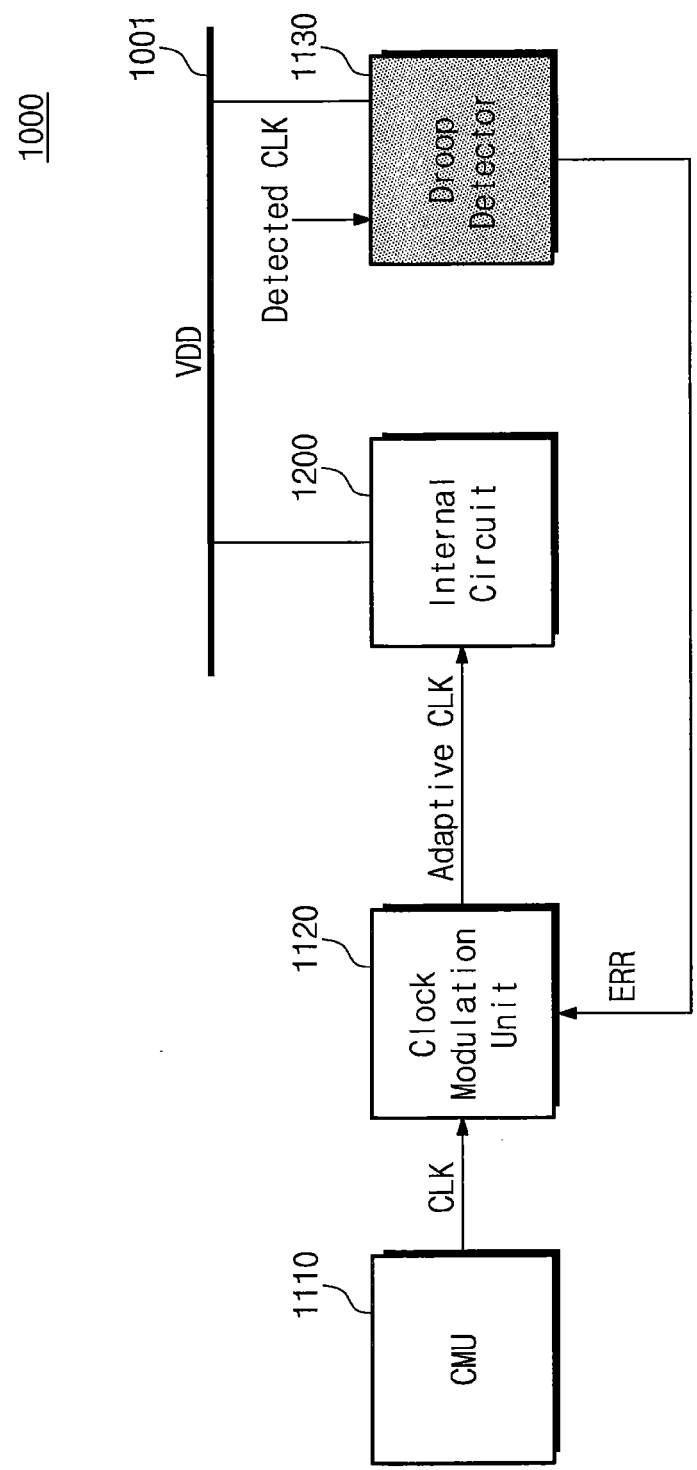
FIG. 10 illustrates an adaptive clocking system according to example embodiments of inventive concepts.

A voltage monitor according to example embodiments of inventive concepts may be applied to an adaptive clocking system. For example, as shown by FIG. 10, an adaptive clocking system 1000 according to example embodiments of inventive concepts may include a clock management unit (CMU) 1100, a clock modulation unit 1120, a droop detector 1130, and an internal circuit 1200.

The clock management unit 1110 may be implemented to generate a clock CLK. The clock modulation unit 1120 may be implemented to receive the clock CLK and error information ERR and to generate a corresponding adaptive clock Adaptive CLK.

The droop detector 1130 may be implemented to monitor voltage variation of a power supply line 1001 providing a power supply voltage VDD in response to a detected clock Detected CLK and to output the error information ERR as a result value. In example embodiments, the droop detector 1130 may be implemented using the voltage monitor or the delay code generating method described with reference to FIGS. 1 to 9. And, the internal circuit 1200 may be implemented to operate in response to the adaptive clock Adaptive CLK.

According to the above-described adaptive clocking system 1000, by varying a clock frequency when voltage drop of the power supply line 1001 is detected through the droop detector 1230, the internal circuit 1200 may operate at a low voltage. Since a typical monitor should use a fixed clock, a separate clock needs to be provided. Meanwhile, the adaptive clocking system 1000 may directly use an adaptive clock when a voltage monitor is used.

Figure 11:
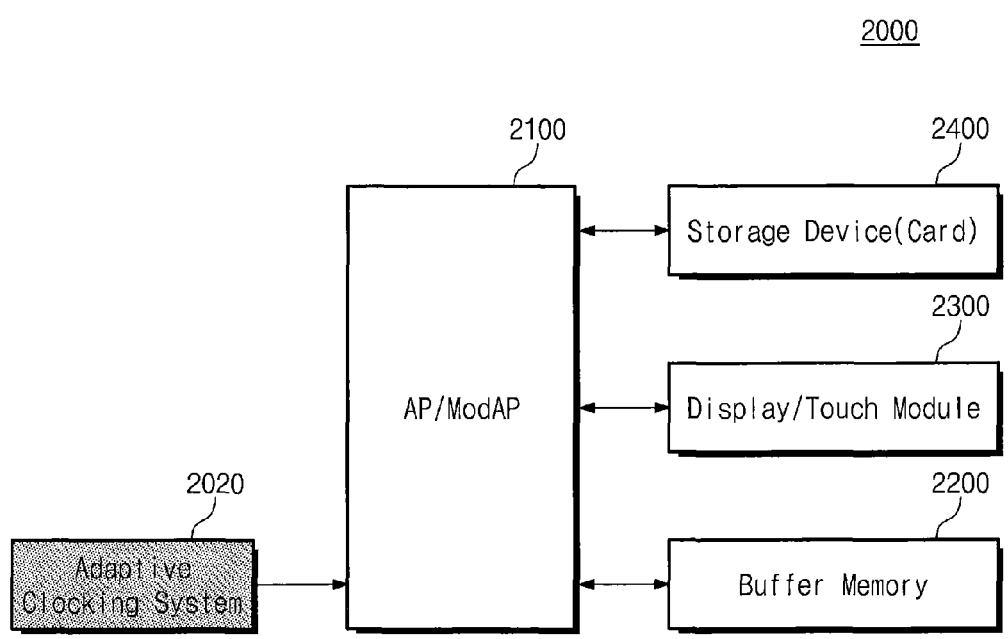
FIG. 11 illustrates a mobile device according to example embodiments of inventive concepts.

FIG. 11 illustrates a mobile device 2000 according to example embodiments of inventive concepts. As illustrated, the mobile device 2000 may include a processor (AP/ModAP) 2100, a buffer memory 2200, a display/touch module 2300, and a storage device 2400.

An adaptive clocking system 2020 may be implemented to include components except for the internal circuit 1200 in the adaptive clocking system 1000 shown in FIG. 10. The adaptive clocking system 2020 may be implemented to detect voltage drop of at least one power supply line, to generate an adaptive clock Adaptive CLK according to a result of the detection, and to provide the adaptive clock Adaptive CLK to the processor 2100.

Although not shown in the drawing, the mobile device 2000 may further include a security chip. The security chip may be implemented to provide a security function. The security chip may include software and/or tamper resistant hardware, allow high-level security, and work in cooperation with a trusted execution environment (TEE) of the processor 2100.

The security chip may include a native operating system (OS), a security storage device that is an internal data storage, an access control block to control an access authority to the security chip, a security function block to perform ownership management, key management, digital signature, and encryption/decryption, and a firmware update block to update firmware of the security chip. The security chip may be, for example, a universal IC card (UICC) such as USIM, CSIM, and ISIM, a subscriber identity module (SIM) card, embedded secure elements (eSE), MicroSD or Stickers.

The processor 2100 may be implemented to control the overall operation of the mobile device 2000 and wired/wireless communication with an external entity. For example, the processor 2100 may be, for example, an application processor (AP) or an integrated modem application processor (ModAP).

The buffer memory 2200 may be implemented to temporarily store data required for a processing operation of the mobile device 2000. The display/touch module 2300 may be implemented to display data processed by the processor 2100 or to receive data from a touch panel. The storage device 2400 may be implemented to store user's data. The storage device 2400 may be an embedded multimedia card (eMMC), a solid state drive (SSD) or a universal flash storage (UFS). The storage device 2400 may include at least one nonvolatile memory device.

A nonvolatile memory device may be a NAND flash memory, a vertical NAND (VNAND) flash memory, a NOR flash memory, a resistive random access memory (RRAM), a phase-change memory (PRAM), a magnetoresistive random access memory (MRAM), a ferroelectric random access memory (FRAM) or a spin transfer torque random access memory (STT-RAM).

In example embodiments of inventive concepts, a three-dimensional (3D) memory array is provided. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

In example embodiments of inventive concepts, the 3D memory array includes vertical NAND strings that are vertically oriented such that at least one memory cell is located over another memory cell. The at least one memory cell may comprise a charge trap layer. Each vertical NAND string may include at least one select transistor located over memory cells, the at least one select transistor having the same structure with the memory cells and being formed monolithically together with the memory cells.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648. A nonvolatile memory device (NVM) according to example embodiments of inventive concepts may be applied to not only a flash memory device in which a charge storage layer includes a conductive floating gate but also a charge trap flash (CTF) memory in which a charge storage layer includes an insulating layer.

The above-described mobile device 2000 may modulate a clock irrespective of a clock frequency in spite of voltage drop to improve its performance.

As described above, a voltage monitor according to example embodiments of inventive concepts generate a delay code using a predelay and a delay difference between a data path and a clock path. Thus, the voltage monitor may detect voltage variation irrespective of clock variation.

The above-disclosed subject matter is to be considered illustrative, and not restrictive, and the appended claims are intended to cover all such modifications, enhancements, and other features, which fall within the true spirit and scope of inventive concepts. Thus, to the maximum extent allowed by law, the scope of inventive concepts is to be determined by the broadest permissible interpretation of the following claims and their equivalents, and shall not be restricted or limited by the foregoing detailed description. While some example embodiments have been particularly shown and described, it will be understood by one of ordinary skill in the art that variations in form and detail may be made therein without departing from the spirit and scope of the claims.

What is claimed is:

1. A voltage monitor, comprising:
a predelay cell having an input terminal responsive to a first clock signal, said predelay cell configured to generate a predelayed clock signal, which is a delayed version of the first clock signal, at an output terminal thereof;
a serially-connected string of data delay cells having an input terminal responsive to the predelayed clock signal;
a serially-connected string of clock delay cells having an input terminal responsive to a second clock signal that is synchronized to the first clock signal; and
a plurality of latches having respective data input terminals, which are responsive to first periodic signals generated at respective output terminals of said serially-connected string of data delay cells, and respective clock input terminals, which are responsive to second periodic signals generated at respective output terminals of said serially-connected string of clock delay cells;
wherein the first periodic signals generated at respective output terminals of said serially-connected string of data delay cells are delayed versions of the predelayed clock signal.

2. The voltage monitor of claim 1, wherein the second clock signal is in-phase with the first clock signal or the second clock signal is a delayed version of the first clock signal.

3. The voltage monitor of claim 1, wherein said predelay cell comprises a serially-connected string of buffer cells that are equivalent to the data delay cells.

4. The voltage monitor of claim 1, wherein the clock delay cells are configured as AND gates.

5. The voltage monitor of claim 1, wherein said predelay cell is configured as a predelay selection circuit comprising a plurality of serially-connected strings of buffer cells and a corresponding plurality of multiplexers responsive to respective bits of a predelay selection code.

6. A voltage monitor comprising:
at least one predelay cell receiving a clock and having a first delay size;
data delay cells serially connected to a data path receiving an output of the at least one predelay cell, the data delay cells having a second delay size;
clock delay cells connected to a clock path receiving the clock, the clock delay cells having a third delay size; and
latch circuits configured to latch an output value of each of the data delay cells in response to a delay clock of each of the clock delay cells;
wherein the output value of each of the data delay cells corresponds to a respective delayed version of the clock provided to said at least one predelay cell; and
wherein said latch circuits are configured to latch the output value of each of the data delay cells in-sync with the delay clock.

7. The voltage monitor of claim 6, wherein the at least one predelay cell and each of the data delay cells are implemented with the same buffer cell.

8. The voltage monitor of claim 6, wherein the third delay size is greater than the second delay size.

9. The voltage monitor of claim 8, wherein each of the data delay cells is implemented with a buffer cell, and
wherein each of the clock delay cells is implemented with an AND gate.

10. The voltage monitor of claim 6, wherein output values latched to the latch circuit is a delay code, and
wherein the delay code corresponds to a value obtained by dividing the first delay size by a difference between the third delay size and the second delay size.

11. The voltage monitor of claim 6, wherein each of the latch circuits is implemented with a flip-flop.

12. A voltage monitor comprising:
a predelay selection circuit connected to a data path receiving a clock and configured to select a predelay size in response to a predelay selection code;
a stage selection circuit configured to select at least one stage in response to a stage selection code to decide a size of delay associated with the data path;
a delay code generation circuit connected to the selected stage and configured to generate a delay code, the delay code generation circuit including serially connected data delay cells associated with the data path and clock delay cells serially connected to a clock path receiving the clock; and
latch circuits configured to latch an output value of each of the data delay cells in response to a clock delayed by each of the clock delay cells.

13. The voltage monitor of claim 12, further comprising:
an internal clock generator configured to receive an external clock and to generate the clock in response to an enable signal.

14. The voltage monitor of claim 12, wherein the predelay selection circuit comprises:
at least one predelay cell; and
at least one multiplexer configured to select one of an output value of the at least one predelay cell and a clock input to the data path in response to the predelay selection code.

15. The voltage monitor of claim 12, wherein the predelay selection circuit comprises:
at least one predelay cell;
at least one first multiplexer configured to select one of an output value of the at least predelay cell and a clock input to the data path in response to the predelay selection code; and
at least one second multiplexer connected to the clock path in response to the predelay selection code.

16. The voltage monitor of claim 12, wherein the stage selection circuit comprises:
a plurality of stages; and
a plurality of multiplexers configured to select at least one of the stages in response to the stage selection code, and
wherein each of the stages comprises:
at least one stage delay cell associated with the data path; and
at least one clock delay cell associated with the clock path.

17. The voltage monitor of claim 16, wherein the number of delay cells included in each of the stages is a multiple of two.

18. The voltage monitor of claim 12, further comprising:
   second latch circuits configured to latch data stored in the latch circuits in response to another clock different from the clock.

19. The voltage monitor of claim 12, wherein a delay size of each of the clock delay cells is greater than a delay size of each of the data delay cells.

20. The voltage monitor of claim 19, wherein each of the clock delay cells is implemented with an AND gate.

\* \* \* \* \*